United States Patent
Yoon et al.

(10) Patent No.: US 9,620,483 B2
(45) Date of Patent: Apr. 11, 2017

(54) SEMICONDUCTOR INTEGRATED CIRCUIT INCLUDING POWER TSVS

(71) Applicant: SK hynix Inc., Icheon-si (KR)

(72) Inventors: Young Hee Yoon, Icheon-si (KR); Ga Young Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 14/928,586

(22) Filed: Oct. 30, 2015

(65) Prior Publication Data
US 2016/0056130 A1 Feb. 25, 2016

(30) Foreign Application Priority Data

Aug. 17, 2012 (KR) .................. 10-2012-0090005

(51) Int. Cl.
| | | |
|---|---|---|
| *G01R 23/175* | (2006.01) | |
| *H01L 25/065* | (2006.01) | |
| *H01L 23/538* | (2006.01) | |
| *H01L 49/02* | (2006.01) | |
| *H01L 23/48* | (2006.01) | |
| *H01L 23/528* | (2006.01) | |
| *H01L 23/00* | (2006.01) | |

(52) U.S. Cl.
CPC ........ *H01L 25/0657* (2013.01); *H01L 23/481* (2013.01); *H01L 23/5286* (2013.01); *H01L 23/5384* (2013.01); *H01L 24/05* (2013.01); *H01L 28/40* (2013.01); *H01L 2224/05025* (2013.01); *H01L 2225/06541* (2013.01); *H01L 2924/0002* (2013.01)

(58) Field of Classification Search
CPC ....... H01L 2924/00; H01L 2224/48227; H01L 2224/73265; H01L 2924/00014; H01L 2924/0002; H01L 2224/32145; H01L 2225/06513; H01L 25/0657; H01L 2224/16145; H01L 2225/06541; H01L 23/481

See application file for complete search history.

(56) References Cited

U.S. PATENT DOCUMENTS

| | | | |
|---|---|---|---|
| 4,975,758 A | 12/1990 | Crafts | |
| 6,538,333 B2 * | 3/2003 | Kong | .................. H01L 25/0657 257/706 |
| 7,123,497 B2 | 10/2006 | Matsui et al. | |

(Continued)

FOREIGN PATENT DOCUMENTS

KR 1020100030151 A 3/2010

OTHER PUBLICATIONS

U.S. Appl. No. 13/720,432, Non-Final Office Action, mailed Jan. 23, 2015.

(Continued)

*Primary Examiner* — Bradley K Smith
*Assistant Examiner* — David Goodwin
(74) *Attorney, Agent, or Firm* — Kilpatrick Townsend & Stockton LLP

(57) ABSTRACT

A semiconductor device including power TSVs for stably supplying a power source is described. A semiconductor device includes a chip power pad placed in a first region of a chip, power through silicon vias (TSVs) connected to the chip power pad and placed in the second region of each of the chips, and metal lines configured to couple the chip power pad and the power TSVs.

8 Claims, 4 Drawing Sheets

(56) References Cited

U.S. PATENT DOCUMENTS

| | | | |
|---|---|---|---|
| 7,456,446 B2* | 11/2008 | Tahira | H01L 27/0207 257/202 |
| 7,834,440 B2 | 11/2010 | Ito et al. | |
| 7,977,962 B2 | 7/2011 | Hargan et al. | |
| 8,035,194 B2 | 10/2011 | Lee et al. | |
| 8,179,120 B2 | 5/2012 | Bhushan et al. | |
| 8,264,065 B2 | 9/2012 | Su et al. | |
| 8,378,495 B2* | 2/2013 | West | H01L 23/481 257/472 |
| 8,547,769 B2 | 10/2013 | Saraswat et al. | |
| 2007/0126105 A1* | 6/2007 | Yamada | G11C 5/02 257/686 |
| 2009/0179215 A1* | 7/2009 | Matsui | H01L 33/40 257/98 |
| 2011/0043215 A1* | 2/2011 | Bhushan | G01R 31/3016 324/537 |
| 2011/0161583 A1 | 6/2011 | Youn | |
| 2011/0291289 A1* | 12/2011 | Yoon | H01L 23/481 257/774 |
| 2012/0153497 A1 | 6/2012 | Lee | |
| 2012/0241972 A1* | 9/2012 | Chen | H01L 23/5286 257/774 |
| 2012/0250443 A1 | 10/2012 | Saraswat et al. | |
| 2013/0119527 A1 | 5/2013 | Luo et al. | |
| 2013/0153899 A1 | 6/2013 | Wada et al. | |

OTHER PUBLICATIONS

U.S. Appl. No. 13/720,432, Final Office Action, mailed Jul. 30, 2015.

\* cited by examiner

SEMICONDUCTOR INTEGRATED CIRCUIT INCLUDING POWER TSVS

CROSS-REFERENCES TO RELATED APPLICATION

The present application is a continuation of U.S. patent application Ser. No. 13/720,432, filed on Dec. 19, 2012, which claims priority under 35 U.S.C. §119(a) to Korean application number 10-2012-0090005, filed on Aug. 17, 2012, in the Korean Intellectual Property Office, both applications are incorporated by reference herein in their entirely.

BACKGROUND

1. Technical Field

The present invention relates to a semiconductor integrated circuit, and more particularly, to a semiconductor integrated circuit including power through silicon vias (TSV)s.

2. Related Art

In recent semiconductor devices, technology for stacking a plurality of semiconductor integrated circuits is being adopted. To achieve high performance while providing a reduction in the size of electrical/electronic products, various techniques for fabricating a stacked package are being developed.

A stacked package in the semiconductor industry field refers to two or more semiconductor chips or packages that are vertically piled up (i.e. stacked vertically). In accordance with this stacked package, for example, a semiconductor memory device can be implemented to have a memory capacity that is twice or more than the memory capacity that can otherwise be achieved for a given chip area using a given semiconductor process technology. Furthermore, the stacked package is advantageous over standard packages in that the memory capacity can be increased while keeping the circuit board mounting area and mounting area efficiency of the device relatively unchanged. Thus, research and development for manufacturing stacked packages are being accelerated.

A stacked package can be fabricated by using a method of stacking pre-packaged semiconductor chips and then packaging the stacked semiconductor chips at once, or by using a method of stacking post-packaged semiconductor chips. The semiconductor chips of a stacked package can be electrically coupled together by using metal wires or by using through silicon vias (TSVs). In particular, a stacked package using the through silicon vias approach has a structure in which the through silicon vias are formed within the semiconductor chips, and the semiconductor chips are vertically coupled using the through silicon vias to physically and electrically connect the semiconductor chips.

A semiconductor device can include distinct regions which can be classified as an active region that includes active circuitry such as memory banks, or a peripheral region that includes pads for interfacing signals and power to other devices.

FIG. 1 is a diagram showing an example arrangement of a semiconductor device. As shown in FIG. 1, the semiconductor device includes a plurality of power lines VDD 1 and VSS 2.

The power lines 1, which are spaced apart from each other, are coupled by metal lines so that power lines 1 have the same VDD voltage potential. Similarly, the power lines 2, which are spaced apart from each other, are coupled by metal lines so that power lines 2 have the same VSS voltage potential. Furthermore, a plurality of cap regions 3 is included between the power lines 1 and 2. Each of the cap regions 3 implements a reservoir capacitor.

A reservoir capacitor functions to compensate for the unstable supply of power due to the parasitic capacitance of a power source. More particularly, the reservoir capacitor can stabilize a power source because the reservoir capacitor provides durability and solidarity against the shaking of the power source and/or various noises on the power signal.

Meanwhile, a dummy region 4 is disposed between the cap regions 3.

The dummy region 4 is a region that includes dummy metal lines. The metal lines within the dummy region 4 are assumed to be in a floating or unconnected state.

Signal TSVs S and power TSVs P are disposed under the region where power lines 1 and 2 run (i.e. outside the active region). The region in which the signal TSVs S and the power TSVs P are disposed is a pad region (i.e. part of the peripheral region where pads are disposed).

In a semiconductor device such as the one described above, the intensity of a power source decreases gradually according to the number of stacked semiconductor chips. FIG. 2 is a perspective view showing that the intensity of a power source voltage is reduced according to an increase in the number of stacked semiconductor chips. In other words, the intensity of power at each incrementally stacked semiconductor chip becomes less and less.

Accordingly, it is desirable to supply a stable and consistent power supply to each semiconductor chip when a plurality of semiconductor chips is stacked.

SUMMARY

In one embodiment of the present invention, a semiconductor integrated circuit includes a plurality of chips which are stacked. Each chip includes an active region including a plurality of reservoir capacitor regions and a plurality of dummy regions, a plurality of dummy lines disposed on each dummy region, and a plurality of power through silicon vias (TSVs) formed in the active region. Each power TSV is positioned between the dummy region and the reservoir capacitor region. A pair of the power TSVs which received a same voltage are electrically coupled using selected dummy lines and power lines electrically coupled with the selected dummy lines.

In one embodiment of the present invention, a semiconductor device includes a chip power pad placed in a first region of a chip, power through silicon vias (TSVs) connected to the chip power pad and placed in the second region of each of the chips, and metal lines configured to couple the chip power pad and the power TSVs.

In another embodiment of the present invention, a semiconductor device includes a pad region having a chip power pad, and an active region including circuitry for performing a function of the semiconductor device, a plurality of power lines, and power through silicon vias (TSVs) coupled to the chip power pad.

BRIEF DESCRIPTION OF THE DRAWINGS

Features, aspects, and embodiments are described in conjunction with the attached drawings, in which.

DETAILED DESCRIPTION

Hereinafter, a semiconductor device according to the present invention will be described below with reference to the accompanying drawings through exemplary embodiments.

Figure 3:
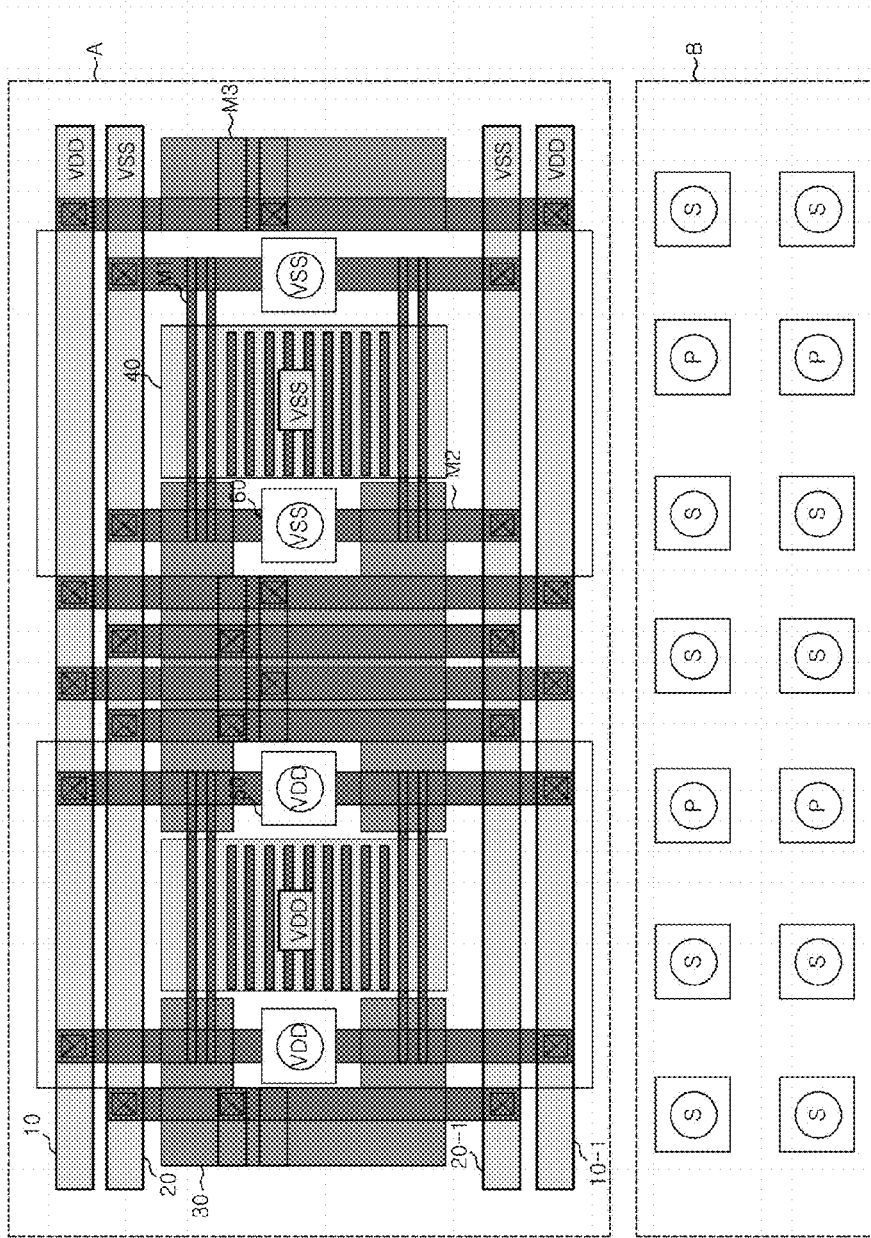
FIG. 3 shows an arrangement of a semiconductor device in accordance with an embodiment of the present invention.

FIG. 3 shows an arrangement of a semiconductor device including power lines in accordance with an embodiment of the present invention.

Referring to FIG. 3, the semiconductor device includes power TSVs in accordance with an embodiment of the present invention, and also includes an active region A, that is, a first region, and a pad region B, that is, a second region.

The active region A includes active circuitry such as memory banks to carry out the functionality of the semiconductor device (not shown), and a plurality of power lines 10, 10-1, 20, and 20-1. According to some embodiments, the active region A is bounded by the set of power lines 10 and 20 and the set of power lines 10-1 and 20-1.

The power lines can supply power sources to circuit units (not shown) within the active region A. That is, the power lines 10 and 10-1 can supply VDD power sources, and the power lines 20 and 20-1 can supply VSS power sources. The power lines are spaced apart from each other, but power lines that are used to supply the same voltage potential are coupled by one or more metal lines. Here, the VDD power lines 10 and 10-1 for supplying the VDD power sources are electrically coupled with each other, and the VSS power lines 20 and 20-1 for supplying the VSS power sources are electrically coupled with each other. The power lines as shown in FIG. 3 are illustrated as being coupled with a third metal line M3 (e.g., metal lines of a third metal layer), but are not limited thereto.

Cap regions 30 and dummy regions 40 are disposed in the space between the set of power lines 10 and 20 and the set of power lines 10-1 and 20-1.

Figure 1:
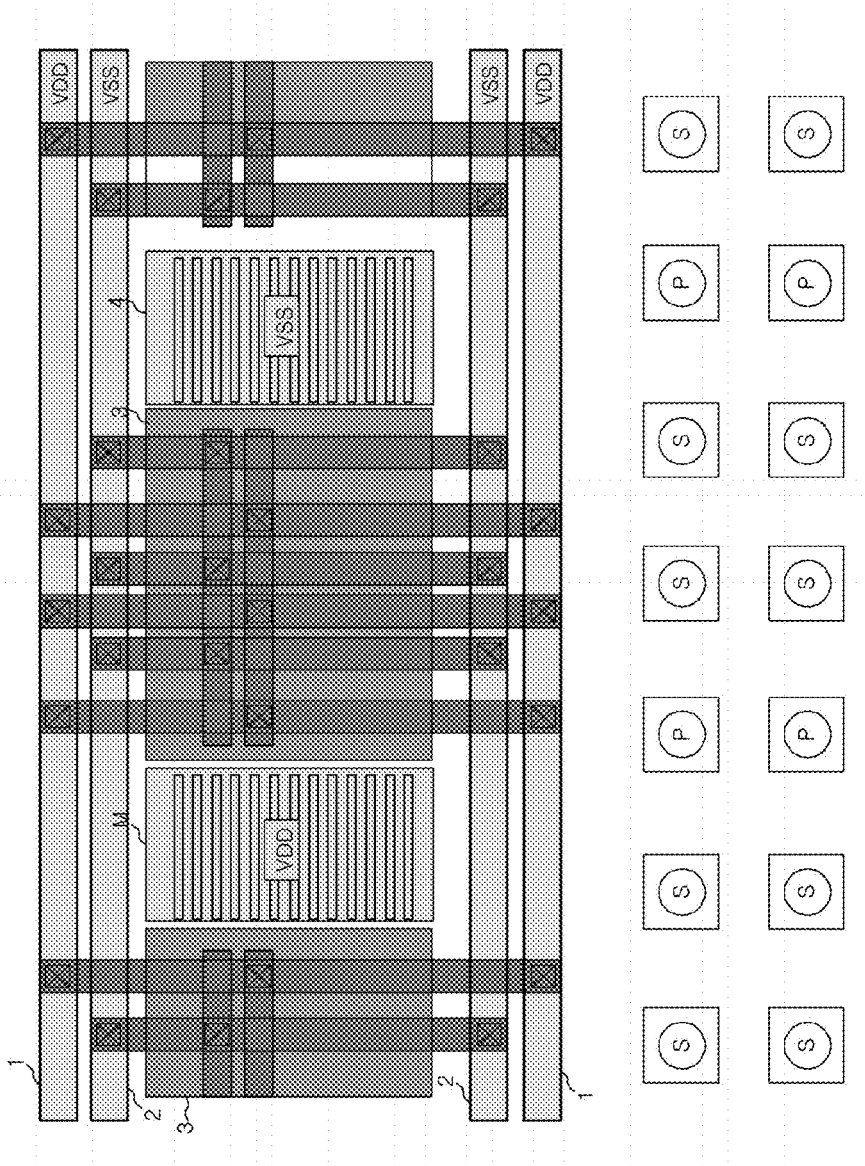
FIG. 1 illustrates an arrangement of a semiconductor device.
Figure 2:
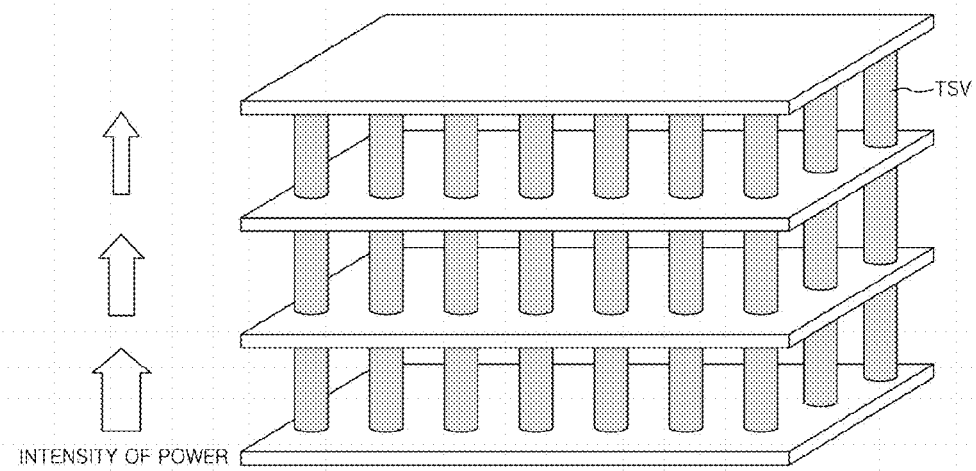
FIG. 2 illustrates the intensity of a power source voltage in stacked semiconductor chips.

Each of the cap regions 30 in accordance with an embodiment of the present invention has a cutout portion, for example, a cutout portion along one or more sides of the cap region. In other words, at least one side of each cap region 30 may have an indentation or a notch receding from the edge. Thus, unlike the semiconductor device shown in FIG. 1, the shape of the cap regions 30 according to embodiments of the present invention may not be a regular rectangular shape. In other embodiments, the cutout portion can span the entire length or width of an edge such that the entire length or width of the cap region is reduced. Power TSVs 50 and 60 within the active region A in accordance with an embodiment of the present invention are placed within the cutout portions of the cap regions 30.

More particularly, each of the cap regions 30 is a reservoir capacitor as described above and is a capacitor region used for compensating for the instability of a power source, for example, to reduce noise and ringing on a power signal that can be caused by the parasitic capacitance of TSVs through which power from a power source is supplied. The cap region 30 in accordance with an embodiment of the present invention can have an area smaller than an area of the cap region used in devices such as the one shown in FIG. 1 because of the cutout or notch provided on one or more sides. Furthermore, the power TSVs 50 and 60 in accordance with an embodiment of the present invention are placed in the respective cutout portions. Accordingly, TSVs can be included in the active region A without having to add additional area to the semiconductor device.

Meanwhile, metal lines within the dummy region 40 are hereinafter illustrated as being first metal lines M1 (e.g., metal lines of a first metal layer), but are not limited thereto. Furthermore, when coupling a chip power pad to the power TSV using the metal lines corresponding to dummy region 40, the chip power pad and the power TSV can be coupled at the edge of a chip pad.

The first metal lines M1 within the dummy region 40 are provided so that they can be coupled when power sources need to be coupled (e.g., to distribute power to different regions), but are otherwise assumed to be in a floating or unconnected state. Accordingly, the power TSVs 50 and 60 within the active region A can be coupled using some of the first metal lines M1 within the respective dummy region 40. Here, the first metal lines M1 used for coupling the power TSVs are illustrated as being metal lines on both sides (that is, the top and bottom, or opposing sides or portions) within the dummy region 40. This arrangement provides for a more balanced and stable supply of power, and also assists in distributing a shock that may occur, for example, when probing is performed in a subsequent test process.

Furthermore, the power TSVs 50 and 60 within the active region A can be coupled to the power lines 10, 10-1, 20, and 20-1, for example, by second metal lines M2 (e.g., metal lines of a second metal layer). Moreover, the power TSVs 50 and 60 within the active region A can also be connected to the chip power pad within the pad region B by the second metal lines M2, so that power from an external source supplied through the chip power pad can be supplied within the active region A through this path.

In other words, the power TSVs connected to the VDD power lines 10 and 10-1 can additionally supply a VDD power source within the active region A, and the TSVs connected to the VSS power lines 20 and 20-1 can additionally supply a VSS power source within the active region A.

In particularly, the power TSVs disposed within the active region A in accordance with an embodiment of the present invention can deliver a more stable and consistent power supply to active region A, because the power TSVs provide active region A with a more direct connection to the chip power pad of the pad region B. That is, a stable power source through a reduced resistance path can be supplied to circuits within the active region A, because the power source is supplied to the circuits using the metal lines coupled to the power TSVs within active region A.

In the prior art, a power source is supplied only from the power pad in the pad region. Accordingly, resistance is increased because the supply path of the power source is complicated, and thus the intensity of the power source is reduced according to an increase in the number of stack semiconductor devices.

In the semiconductor device in accordance with an embodiment of the present invention, since the TSVs are disposed within the active region A, resistance can be reduced and a stable power source can be supplied because the power source is directly supplied within the active region A using the metal lines coupled to the power TSVs.

In other words, an external power source voltage is supplied to the chip power pad of the pad region B, the power source voltage is supplied from the chip power pad to the power TSVs within the active region A through the second metal lines M2, and the power source voltage is then supplied from the power TSVs to the circuits within the active region A through the first metal lines M1.

Figure 4:
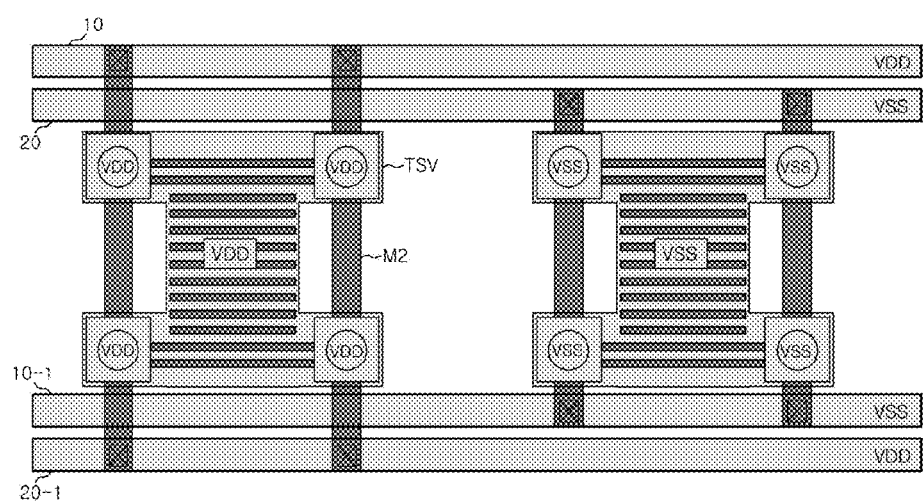
FIG. 4 shows an arrangement of a semiconductor device in accordance with another embodiment of the present invention.

FIG. 4 shows an arrangement of a semiconductor device in accordance with another embodiment of the present invention.

The semiconductor device is described with reference to FIG. 4, but details of portions redundant with those of FIG. 3 are either not repeated or are described in brief.

In FIG. 4, the number of power TSVs with the active region is increased as compared to that of the embodiment shown in FIG. 3. VDD power lines 10 and 10-1 are coupled by second metal lines M2 to have the same voltage potential.

VSS power lines 20 and 20-1 are coupled by second metal lines M2 to have the same voltage potential.

Meanwhile, the number of power TSVs connected to the VDD power lines 10 and 10-1 is four. The number of power TSVs within the active region can be increased in order to supply stable VDD power sources.

Likewise, the number of TSVs connected to the VSS power lines 20 and 20-1 is four. The number of power TSVs within the active region can be added in order to supply stable VSS power sources.

The additional power TSVs allow stable power sources to be supplied to a plurality of stacked chips through paths having further reduced resistance.

It is to be noted that in some embodiments, the number of TSVs can be increased or reduced independently for a specific power source voltage as understood and modified by those skilled in the art. In other words, for different power source voltages, the number of TSVs can be different.

For example, in another embodiment, the number of TSVs for the VDD power source within the active region can be four in order to supply the VDD power source more stably, whereas the number of TSVs for the VSS power source can be two.

As another example, in a further embodiment, the number of TSVs for a VDD power source within the active region can be two, and the number of TSVs for the VSS power source within the active region can be four.

While certain embodiments have been described above, it will be understood to those skilled in the art that the embodiments described are by way of example only. Accordingly, the semiconductor device described herein should not be limited based on the described embodiments. Rather, the device described herein should only be limited in light of the claims that follow when taken in conjunction with the above description and accompanying drawings.

What is claimed is:

1. A semiconductor integrated circuit, comprising:
   a plurality of chips which are stacked,
   wherein each chip includes:
      an active region including a plurality of reservoir capacitor regions and a plurality of dummy regions, wherein the reservoir capacitor regions and the dummy regions are alternately arranged in a first direction being parallel with a surface of the chip; and
      a plurality of dummy lines disposed on each dummy region and extended along the first direction;
   a pair of power source line groups arranged in the active region, wherein the reservoir capacitor regions and the dummy regions are arranged between the pair of power source line groups, and each of the power source line groups includes a VDD power source line and a VSS power source line; and
   power through silicon vias (TSVs) formed in the active region, wherein each of the power TSVs is positioned between a dummy region and a reservoir capacitor region,
   wherein the plurality of dummy lines of a selected dummy region are electrically coupled with the power TSVs which are arranged at sides of the selected dummy region.

2. The semiconductor integrated circuit according to claim 1, further comprising:
   power lines that are extended along a second direction being perpendicular to the first direction.

3. The semiconductor integrated circuit according to claim 2, wherein the power lines are disposed on the reservoir capacitor regions to be connected to the power TSVs.

4. The semiconductor integrated circuit according to claim 3, wherein a selected power line and another selected power line are electrically coupled using a selected dummy line.

5. The semiconductor integrated circuit according to claim 1, wherein the plurality of dummy lines correspond to a first metal layer.

6. The semiconductor integrated circuit according to claim 5, wherein the power lines correspond to a second metal layer which is formed over the first metal layer.

7. The semiconductor integrated circuit according to claim 1, further comprising:
   a pad region spaced from the active region; and
   a plurality of chip power pads placed in the pad region.

8. The semiconductor integrated circuit according to claim 7, wherein the chip power pads are electrically coupled with the power TSVs, respectively.

* * * * *